United States Patent
Ando et al.

(10) Patent No.: US 12,191,352 B2
(45) Date of Patent: Jan. 7, 2025

(54) USING DIFFERENT WORK-FUNCTIONS TO REDUCE GATE-INDUCED DRAIN LEAKAGE CURRENT IN STACKED NANOSHEET TRANSISTORS

(71) Applicant: International Business Machines Corporation, Armonk, NY (US)

(72) Inventors: Takashi Ando, Eastchester, NY (US); Ruilong Xie, Niskayuna, NY (US); Pouya Hashemi, Purchase, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 679 days.

(21) Appl. No.: 17/483,870

(22) Filed: Sep. 24, 2021

(65) Prior Publication Data

US 2023/0099254 A1 Mar. 30, 2023

(51) Int. Cl.
| | |
|---|---|
| *H01L 29/06* | (2006.01) |
| *H01L 27/088* | (2006.01) |
| *H01L 29/417* | (2006.01) |
| *H01L 29/423* | (2006.01) |
| *H01L 29/78* | (2006.01) |

(52) U.S. Cl.
CPC ...... *H01L 29/0673* (2013.01); *H01L 27/0886* (2013.01); *H01L 29/0653* (2013.01); *H01L 29/41791* (2013.01); *H01L 29/42364* (2013.01); *H01L 29/785* (2013.01)

(58) Field of Classification Search
CPC .......................... H01L 27/127; H01L 29/401
See application file for complete search history.

(56) References Cited

U.S. PATENT DOCUMENTS

| | | |
|---|---|---|
| 8,012,828 B2 | 9/2011 | Min et al. |
| 9,461,114 B2 | 10/2016 | Obradovic et al. |
| 9,899,529 B2 | 2/2018 | Hong et al. |

(Continued)

FOREIGN PATENT DOCUMENTS

| | | |
|---|---|---|
| CN | 109473473 A | 3/2019 |
| CN | 111183518 A | 5/2020 |
| EP | 3588578 A1 | 1/2020 |

OTHER PUBLICATIONS

International Search Report and Written Opinion mailed Sep. 29, 2022 in PCT/CN2022/103572; 9 pages.

(Continued)

*Primary Examiner* — William A Harriston
(74) *Attorney, Agent, or Firm* — Cantor Colburn LLP; Samuel Waldbaum

(57) ABSTRACT

Embodiments of the invention are directed to a transistor device that includes a channel stack having stacked, spaced-apart, channel layers. A first source or drain (S/D) region is communicatively coupled to the channel stack. A tunnel extends through the channel stack, wherein the tunnel includes a central region and a first set of end regions. The first set of end regions is positioned closer to the first S/D region than the central region is to the first S/D region. A first type of work-function metal (WFM) is formed in the first set of end regions, the first WFM having a first work-function (WF). A second type of WFM is formed in the central region, the second type of WFM having a second WF, wherein the first WF is different than the second WF.

20 Claims, 12 Drawing Sheets

(56) References Cited

U.S. PATENT DOCUMENTS

| | | |
|---|---|---|
| 9,947,804 B1 | 4/2018 | Frougier et al. |
| 10,340,374 B2 | 7/2019 | Dewey et al. |
| 10,424,639 B1 | 9/2019 | Miao et al. |
| 10,475,898 B2 | 11/2019 | Chung et al. |
| 10,553,495 B2 | 2/2020 | Cheng et al. |
| 2020/0294866 A1 | 9/2020 | Cheng et al. |
| 2021/0082914 A1 | 3/2021 | Lee et al. |
| 2021/0183951 A1 | 6/2021 | Karda et al. |
| 2021/0217846 A1* | 7/2021 | Hashemi .......... H01L 29/42376 |

OTHER PUBLICATIONS

Hinkle et al., "Dipole Controlled Metal Gate with Hybrid Low Resistivity Cladding for Gate-Last CMOS with Low Vt," 2010 Symposium on VLSI Technology (VLSIT), IEEE, 2010, pp. 183-184.

Hu, "Improving the gate-induced drain leakage and on-state current of fin-like thin film transistors with a wide drain." Applied Sciences 8.8 (2018): 1406.

* cited by examiner

USING DIFFERENT WORK-FUNCTIONS TO REDUCE GATE-INDUCED DRAIN LEAKAGE CURRENT IN STACKED NANOSHEET TRANSISTORS

BACKGROUND

The present invention relates in general to fabrication methods and resulting structures for semiconductor devices. More specifically, the present invention relates to fabrication methods and resulting structures for using different work-functions to reduce the gate-induced drain leakage (GIDL) current in stacked nanosheet transistors.

In contemporary semiconductor device fabrication processes, a large number of metal oxide semiconductor field effect transistors (MOSFETs), such as n-type field effect transistors (nFETs) and p-type field effect transistors (pFETs), are fabricated on a single wafer. Non-planar MOSFET architectures (e.g., fin-type FETs (FinFETs) and nanosheet FETs) can provide increased device density and increased performance over planar MOSFETs. For example, nanosheet FETs, in contrast to conventional planar MOSFETs, include a gate stack that wraps around the full perimeter of multiple stacked and spaced-apart nanosheet channel regions for a reduced device footprint and improved control of channel current flow.

GIDL current is undesired and can occur in MOSFETs due to the high electric field between the gate and the drain. Significant GIDL current can be detected in thin gate oxide MOSFETs at drain voltages much lower than the junction breakdown voltage. The mechanism responsible for GIDL current in MOSFETs is the band-to-band tunneling that can occur in the reverse biased channel-drain interface, as well as the channel-drain interface being positioned within the gate-to-drain overlap region.

SUMMARY

Embodiments of the invention are directed to a transistor device that includes a channel stack having stacked, spaced-apart, channel layers. A first source or drain (S/D) region is communicatively coupled to the channel stack. A tunnel extends through the channel stack, wherein the tunnel includes a central region and a first set of end regions. The first set of end regions is positioned closer to the first S/D region than the central region is to the first S/D region. A first type of work-function metal (WFM) is formed in the first set of end regions, the first WFM having a first work-function (WF). A second type of WFM is formed in the central region, the second type of WFM having a second WF, wherein the first WF is different than the second WF.

Embodiments of the invention are directed to a method of forming a transistor device that includes forming a channel stack having stacked, spaced-apart, channel layers. A first S/D region is formed and communicatively coupled to the channel stack. A tunnel is formed to extend through the channel stack, wherein the tunnel includes a central region and a first set of end regions. The first set of end regions is positioned closer to the first S/D region than the central region is to the first S/D region. A first type of WFM is formed in the first set of end regions, the first WFM having a first WF. A second type of WFM is formed in the central region, the second type of WFM having a second WF, wherein the first WF is different than the second WF.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-12 depict multiple cross-sectional views of a nanosheet-based structure after various fabrication operations for forming a stacked-nanosheet transistor having differential work-functions for reducing GIDL currents in accordance with aspects of the invention, in which:

FIG. 1 depicts cross-sectional views of the nanosheet-based structure after initial fabrication operations in accordance with aspects of the present invention;

FIG. 2 depicts cross-sectional views of the nanosheet-based structure after additional fabrication operations in accordance with aspects of the present invention;

FIG. 3 depicts cross-sectional views of the nanosheet-based structure after additional fabrication operations in accordance with aspects of the present invention;

FIG. 4 depicts cross-sectional views of the nanosheet-based structure after additional fabrication operations in accordance with aspects of the present invention;

FIG. 5 depicts cross-sectional views of the nanosheet-based structure after additional fabrication operations in accordance with aspects of the present invention;

FIG. 6 depicts cross-sectional views of the nanosheet-based structure after additional fabrication operations in accordance with aspects of the present invention;

FIG. 7 depicts cross-sectional views of the nanosheet-based structure after additional fabrication operations in accordance with aspects of the present invention;

FIG. 8 depicts cross-sectional views of the nanosheet-based structure after additional fabrication operations in accordance with aspects of the present invention; and FIG. 9 depicts cross-sectional views of the nanosheet-based structure after additional fabrication operations in accordance with aspects of the present invention;

FIG. 10 depicts cross-sectional views of the nanosheet-based structure after fabrication operations in accordance with aspects of the present invention;

FIG. 11 depicts cross-sectional views of the nanosheet-based structure after additional fabrication operations in accordance with aspects of the present invention; and FIG. 12 depicts cross-sectional views of the nanosheet-based structure after additional fabrication operations in accordance with aspects of the present invention.

DETAILED DESCRIPTION

Figure 1:
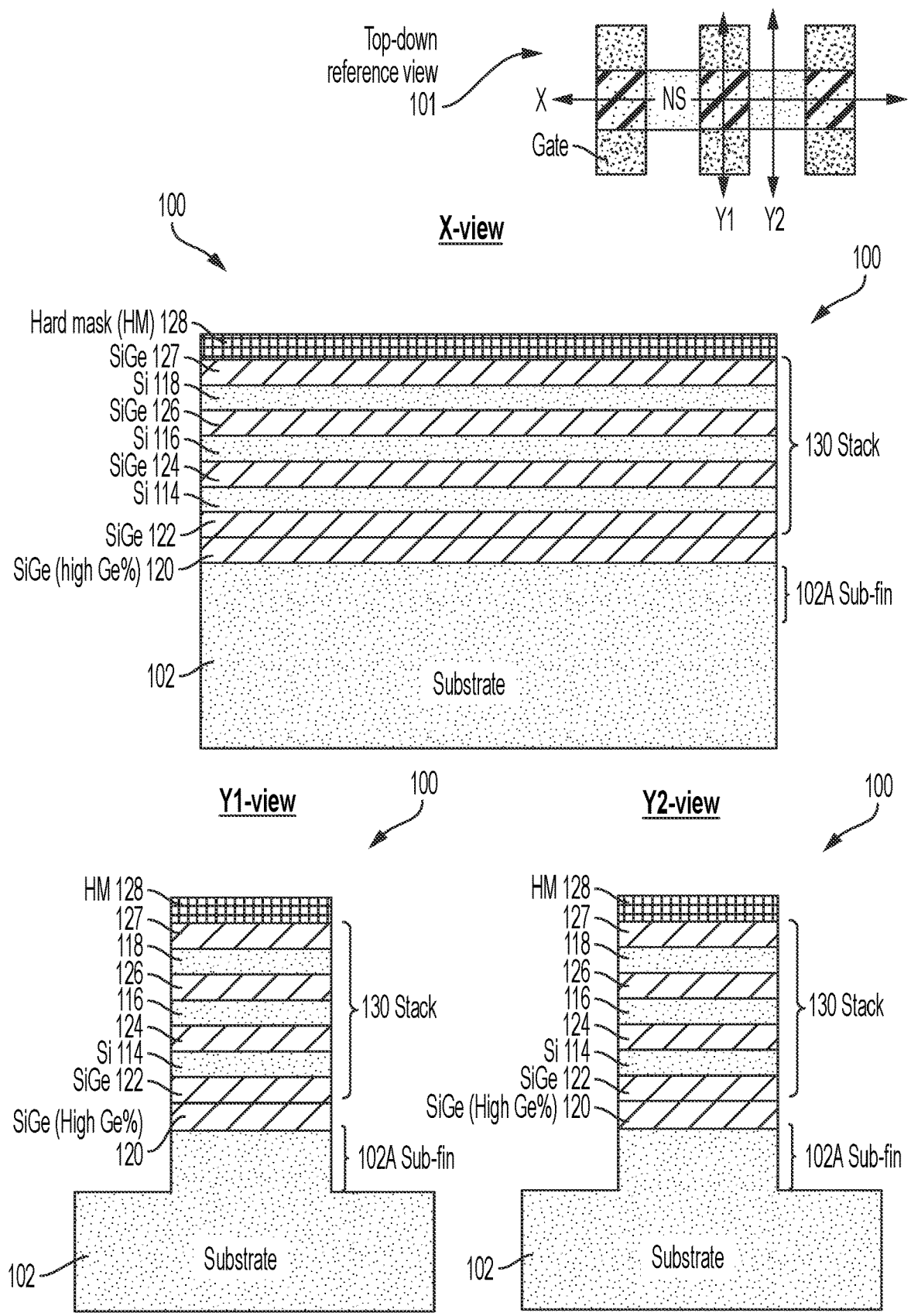

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, semiconductor devices (e.g., FETs) are formed using active regions of a wafer. The active regions are defined by isolation regions used to separate and electrically isolate adjacent semiconductor devices. For example, in an IC having a plurality of MOSFETs, each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of thin nanosheets (e.g., about 3 nm to about 8 nm thick). In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions.

GAA nanosheet FETs are fabricated by forming alternating layers of non-sacrificial nanosheets and sacrificial nanosheets. The sacrificial nanosheets are released from the non-sacrificial nanosheets before the FET device is finalized. For n-type FETs, the non-sacrificial nanosheets are typically silicon (Si) and the sacrificial nanosheets are typically silicon germanium (SiGe). For p-type FETs, the non-sacrificial nanosheets can be SiGe and the sacrificial nanosheets can be Si. In some implementations, the non-sacrificial nanosheet of a p-type FET can be SiGe or Si, and the sacrificial nanosheets can be Si or SiGe. Forming the GAA nanosheets from alternating layers of non-sacrificial nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior non-sacrificial electrostatics control, which is necessary for continuously scaling gate lengths down to seven (7) nanometer CMOS technology and below. The use of multiple layered SiGe/Si sacrificial/non-sacrificial nanosheets (or Si/SiGe sacrificial/non-sacrificial nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. For example, as the size of MOSFETs and other devices decreases, the dimensions of S/D regions, channel regions, gate electrodes, and gate oxides also decrease. As MOSFET gate oxides become thinner, and at higher VDD (i.e., higher potential between the gate and the drain), the electric field across the gate oxide increases, which also increases GIDL current.

Turning now to an overview of aspects of the invention, embodiments of the invention provide a stacked nanosheet transistor designed configured to provide a gate structure formed from a first work-function metal (WFM) and a second WFM. The first WFM has a first work-function (WF), and the second WFM has second WF. The nanosheet transistor is fabricated in accordance with embodiments of the invention to have unique structures that enable the first WFM to be positioned closer to the source or drain (S/D) regions than second WFM is to the S/D regions. In accordance with aspects of the invention, the first WF is different than the second WF, which creates a WF gradient between the central region of the nanosheet channel to either of the S/D regions. This WF gradient relaxes the electric field across the gate oxide, which reduces GIDL currents in the stacked nanosheet transistor.

In embodiments of the invention, space for the first WFM and the second WFM is created by increasing the depth of indentations that house inner spacers of the stacked nanosheet transistor. The increased indentation depth enables the nanosheet structure to, during fabrication, accommodate a channel trimming process that creates a cavity (or a tunnel) defined by trimmed portions of the channel nanosheet and portions of the inner spacers. The cavity/tunnel includes end cavity/tunnel regions and a central cavity/tunnel region between the end cavity/tunnel regions. Each end region is closer to one of the S/D regions than the central region. In accordance with aspects of the invention, the first WFM is formed in each end cavity/tunnel region, and the second WFM is formed in the central cavity/tunnel region, thereby creating a WFM differential between the central cavity/tunnel region and either of the end cavity/tunnel regions. This WF differential relaxes the electric field across the gate oxide, which reduces GIDL currents in the stacked nanosheet transistor.

In embodiments of the invention, the first WFM and the second WFM are formed from a combination of materials that provide appropriate threshold voltages for the stacked nanosheet transistor, while also providing a WF differential between the central cavity/tunnel region and either of the end cavity/tunnel regions, thereby relaxing the electric field across the gate oxide, which reduces GIDL currents in the stacked nanosheet transistor. In some embodiments of the invention, the WFs are a property of the chosen WFM, and values of the chosen WFM's WF are modulated (increased or decreased) by layering an oxygen gettering material on the WFM and separated from the gate oxide. In general, a "gettering" or "getter" material is a reactive material that exhibits the property of "getting" or scavenging another material. For example, an oxygen getter material exhibits the property of combining with nearby oxygen molecules chemically or by absorption, which removes oxygen from either the environment or from another material to which the oxygen getter material is communicatively coupled. Al is an example of an oxygen gettering material because Al is effective at gettering (i.e., reacting with and removing) oxygen that is present in either the environment or another material to which the Al is communicatively coupled. By placing an oxygen gettering material such as aluminum on a WFM, the oxygen gettering material pulls oxygen from the gate oxide, which creates oxygen vacancies in the gate oxide, which reduces the EFW of the chosen WFM.

In some embodiments of the invention, the nanosheet transistor is an NFET, the first WFM is a tri-layer that includes an oxygen gettering (or WF modulating) layer, and the second WFM is a tri-layer also including an oxygen getting (or WF modulating) layer. The first WFM tri-layer is on the gate oxide and is formed from a layer of TiN at a first thickness (T1); a layer of Al-containing alloy (e.g., TiAlC); and a layer of TiN. The second WFM tri-layer is on the gate oxide and is formed from a layer of TiN at a second thickness (T2); a layer of Al-containing alloy (e.g., TiAlC); and a layer of TiN. In accordance with aspects of the invention, T1 is relatively thin, and T2 is relatively thick, which means that T1<T2. By providing a tri-layer WFM configuration for both the first WFM and the second WFM, and by maintaining T1 relatively thin and less than T2, the oxygen gettering effects for the first WFM becomes higher than that for the second WFM, resulting in lower thresholds voltage near the S/D regions compared to the center region on the channel. This helps in reducing GIDL currents.

In some embodiments of the invention, the nanosheet transistor is a PFET, the first WFM is a WFM with no oxygen gettering layer, and the second WFM is a tri-layer that includes an oxygen gettering layer. The first WFM layer is on the gate oxide and is formed from a layer of TiN. The second WFM tri-layer is on the gate oxide and is formed from a layer of TiN at a third thickness (T3); a layer of Al-containing alloy (e.g., TiAlC); and a layer of TiN. In accordance with aspects of the invention, T3 is relatively thick. In some embodiments of the invention T3>T2>T1. By providing a tri-layer WFM configuration for only the second WFM, and by maintaining T3 relatively thick and greater than T2, lower threshold voltages near the S/D regions compared to the center region on the channel can be achieved, while the threshold voltages of the center region remains acceptable for PFET devices.

Turning now to a more detailed description of fabrication operations and resulting structures according to aspects of the invention, FIGS. 1-12 depict a nanosheet-based structure 100 after various fabrication operations for forming nanosheet FETs having a first WFM that is nearest the S/D that is different from a second WFM that is nearest the channel nano sheet. For ease of illustration, the fabrication operations depicted in FIGS. 1-12 will be described in the context of forming one (1) nanosheet stack 130 (shown in FIG. 1) that is etched into three (3) nanosheet stacks 130 (shown in FIGS. 3-13). It is intended, however, that fabrication operations described herein apply equally to the fabrication of any number of the nanosheet stacks 130.

Although the cross-sectional diagrams depicted in FIGS. 1-12 are two-dimensional, it is understood that the diagrams depicted in FIGS. 1-12 represent three-dimensional structures. To assist with visualizing the three-dimensional features, the top-down reference diagram 101 shown in FIG. 1 provides a reference point for the various cross-sectional views (X-view, Y1-view, and Y2-view) shown in FIGS. 1-12. The X-view is a side view taken across the three gates, the Y1-view is an end view taken through the active gate, and the Y2-view is an end view taken through a portion of the nanosheet (NS) stack where one of the S/D regions is (or will be) formed.

FIG. 1 depicts cross-sectional views of the nanosheet-based structure 100 after initial fabrication operations in accordance with aspects of the present invention. As shown in FIG. 1, the nanosheet stack 130 is formed over the substrate 102. The nanosheet stack 130 includes an alternating series of SiGe sacrificial nanosheet layers 120, 122, 124, 126, 127 and Si nanosheet layers 114, 116, 118. In accordance with aspects of the invention, the alternating nanosheet layers 120, 122, 114, 124, 116, 126, 118, 127 of the nanosheet stack 130 are formed by epitaxially growing one nanosheet layer then the next until the desired number and desired thicknesses of the nanosheet layers are achieved. A hard mask layer (not shown) is deposited over the alternating nanosheet layers 120, 122, 114, 124, 116, 126, 118, 127 and the hard mask layer and the alternating nanosheet layers 120, 122, 114, 124, 116, 126, 118, 127 are etched to define the hard mask (HM) 128, the nanosheet stack 130, and the sub-fin 102A of the substrate 102. The hard mask layer and the resulting HM 128 can be any suitable dielectric, including but not limited to SiN.

In embodiments of the invention, each of the nanosheet layers 120, 122, 114, 124, 116, 126, 118, 127 can have a vertical direction thickness in the range from about 5 nm to about 20 nm, in the range from about 10 nm to about 15 nm, or about 10 nm. Other vertical direction thicknesses are contemplated. Although eight (8) alternating layers 120, 122, 114, 124, 116, 126, 118, 127 are depicted in the figures, any number of alternating layers can be provided.

Epitaxial materials can be grown from gaseous or liquid precursors using, for example, vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on non-crystalline surfaces such as silicon dioxide or silicon nitride.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments of the invention, the SiGe sacrificial nanosheet layers 122, 124, 126, 127 can be about SiGe 20%. The notation "SiGe 20%" is used to indicate that 20% of the SiGe material is Ge and 80% of the SiGe material is Si. In some embodiments of the invention, the Ge percentage in the SiGe sacrificial nanosheet layers 122, 124, 126, 127 can be any value, including, for example a value within the range from about 20% to about 45%.

In embodiments of the invention, the SiGe sacrificial nanosheet layer 120 has a Ge percentage that is sufficiently greater than the Ge percentage in the SiGe sacrificial nanosheet layers 122, 124, 126, 127 to provide etch selectivity between the sacrificial nanosheet layer 120 and the sacrificial nanosheet layers 122, 124, 126, 127. In some aspects of the invention, the Ge percentage in the SiGe sacrificial nanosheet layer 120 is above about 55%. In some aspects of the invention, the sacrificial nanosheet layers 122, 124, 126, 127 can be SiGe 25%, and the sacrificial nanosheet layer 120 can be at or above about SiGe 55%.

Figure 2:
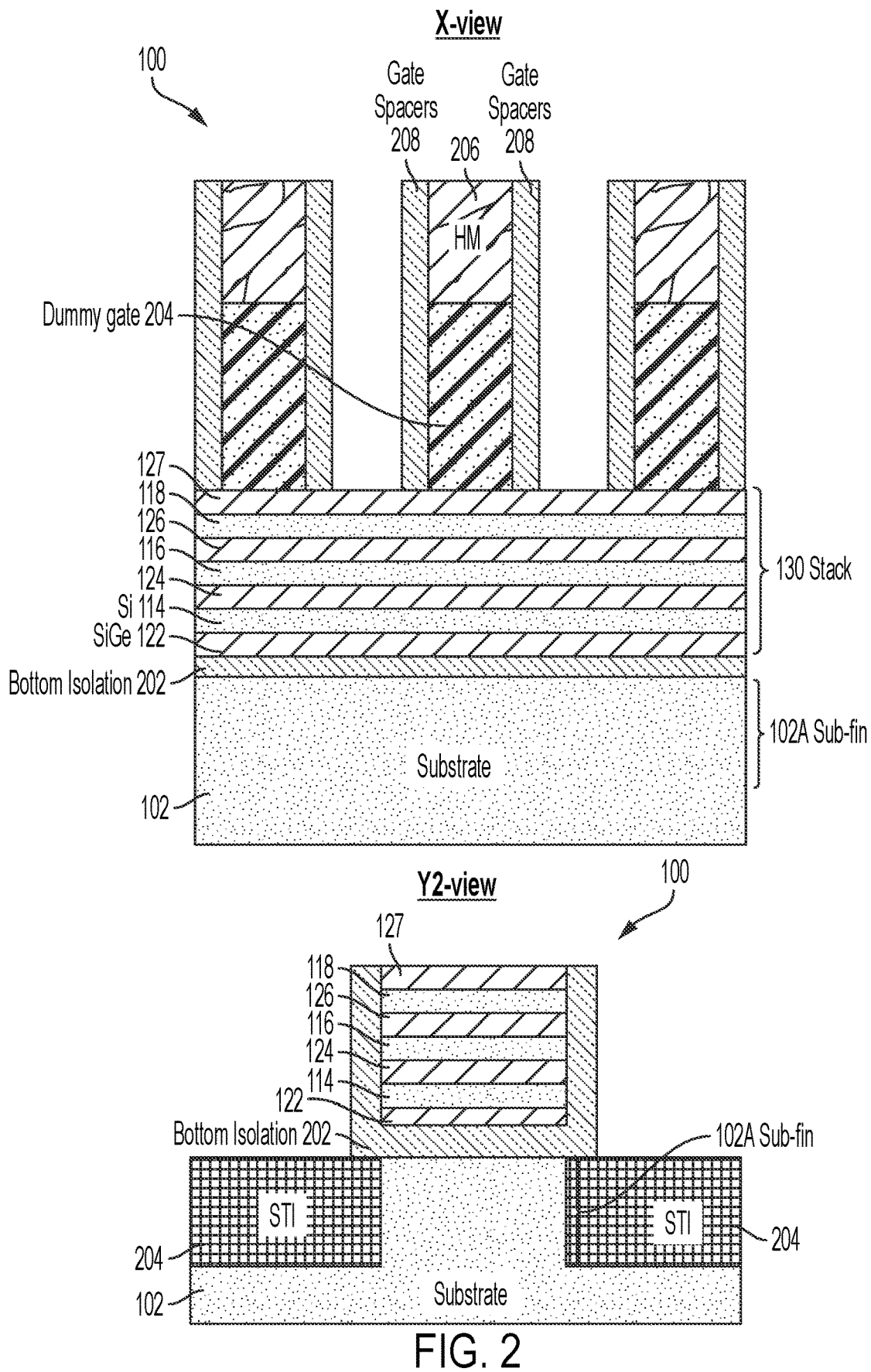

In FIG. 2, known fabrication operations have been used to, prior to formation of dummy gates 204, deposit a thin layer of gate oxide (not shown separately) over the nanosheet stack 130. In FIG. 2, the dummy gate 204 represents the combination of the thin layer of gate oxide (e.g., SiO$_2$) and a material (e.g., amorphous silicon (a-Si)) from which the dummy gates 204 are formed.

Referring still to FIG. 2, known fabrication operations (e.g., an RIE) have been used to form dummy gates 204. In embodiments of the invention, the dummy gates 204 can be formed by depositing and planarizing a layer of dummy gate material (not shown) over the gate oxide (not shown separately from the topmost nanosheet 127). In some embodiments of the invention, the dummy gate material can be polycrystalline Si. In some embodiments of the invention, the dummy gate material can be amorphous Si (a-Si). After being deposited, the dummy gate material is planarized (e.g., by CMP) to a desired level. Known semiconductor fabrication operations are used to form patterned/etched hard masks 206 on a top surface of the planarized dummy gate material. In embodiments of the invention, the hard masks 206 can be formed by depositing a layer of hard mask material and patterning then etching the deposited hard mask layer to form the hard masks 206. The pattern used to form the hard masks 206 defines the footprints of the dummy gates 204 and the gate oxide. In embodiments of the invention, the hard masks 206 can be formed from oxide and/or nitride materials. The dummy gate material is selectively etched such that portions of the dummy gate material that are not under the hard masks 206 are selectively removed, thereby forming the dummy gates 204 over the gate oxide and the nanosheet stack 130.

Referring still to FIG. 2, known fabrication operations have been used to selectively remove the portions of the gate oxide that are not under the dummy gates 204, and a DHF cleaning has been performed to ensure that all of the gate oxide that is not under the dummy gates 204 has been removed.

Referring still to FIG. 2, known fabrication operations have been used to selectively remove the bottommost SiGe sacrificial nanosheet layer 120 (shown in FIG. 1) followed by depositing dielectric material used to form offset gate spacers 208 on sidewalls of the dummy gates 204. The deposited dielectric material also fills in the space that was occupied by the removed sacrificial nanosheet layer 120, thereby forming the bottom isolation region 202, which will isolate the substrate 102 from active regions of the final nanosheet transistor 1200 (shown in FIG. 12). In embodiments of the invention, the offset gate spacers 208 can be formed by depositing the dielectric material over the nanosheet-base structure 100 then directionally etching (e.g., using an RIE) the dielectric material to form the gate spacers 208. In embodiments of the invention, the offset gate spacers 208 and the bottom isolation 202 can be formed from any suitable dielectric material including, for example, silicon oxide, silicon nitride, silicon oxynitride, SiBCN, SiOCN, SiOC, or any suitable combination of those materials. In some embodiments of the invention, the offset gate spacers 208 and/or the bottom isolation region 202 can be a low-k dielectric material.

Referring still to FIG. 2, as best shown in the Y2-view, a shallow trench isolation (STI) region 204 has been formed adjacent the sub-fin 102A. In embodiments of the invention, the STI region 204 can be formed as an oxide. An example process to form the STI region 204 includes depositing an STI dielectric material (e.g., an oxide) (not shown) adjacent the sub-fin 102a followed by a CMP planarization and a recess of the STI dielectric material to form the STI region 204.

Figure 3:
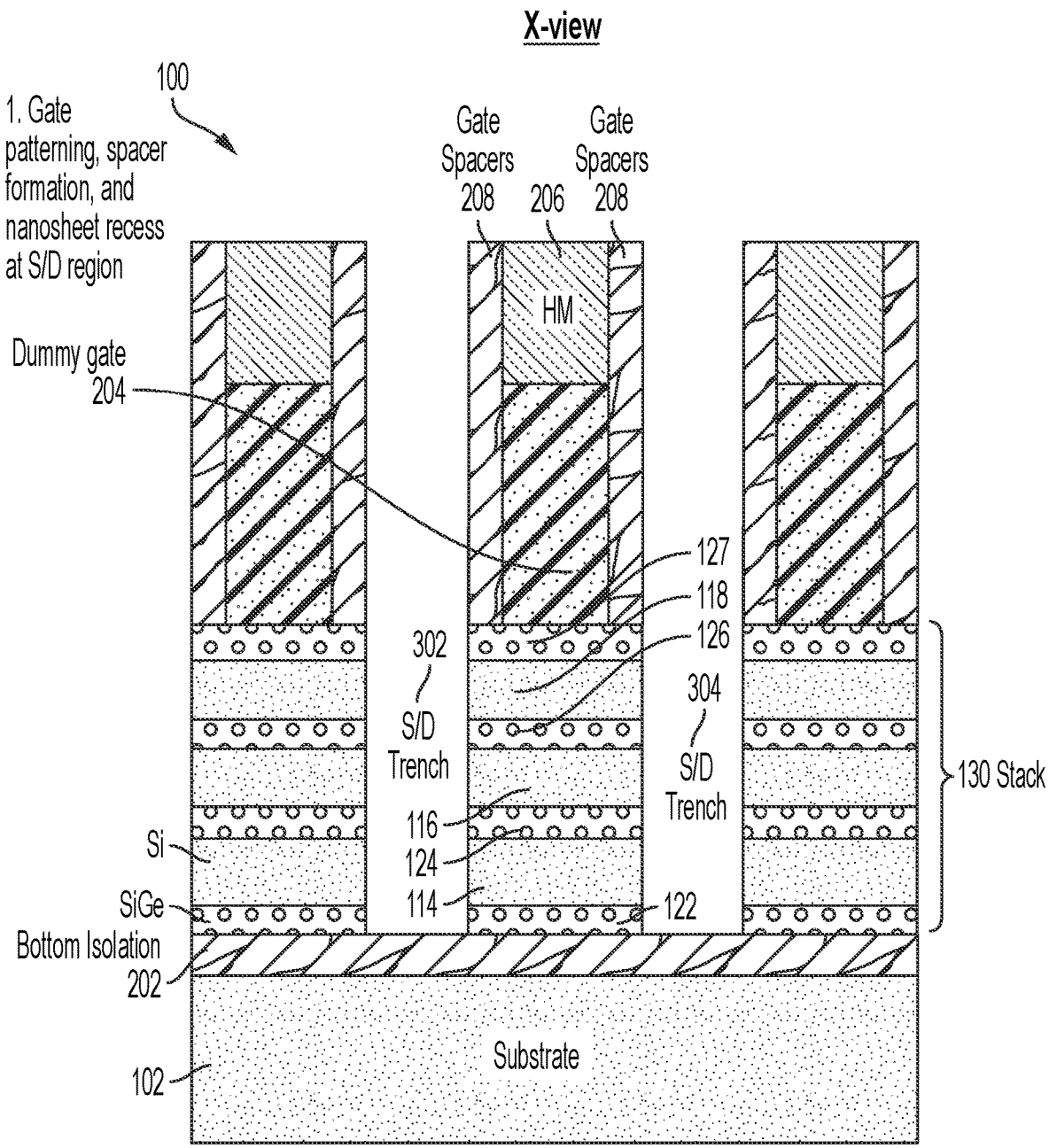

In FIG. 3, the portions of the nanosheet stack 130 that are not covered by the gate spacers 208 and the dummy gates 204 are etched, thereby forming multiple instances of the nanosheet stack 130; forming alternating layers of SiGe sacrificial nanosheets 122, 124, 126, 127 and Si nanosheets 114, 116, 118 in each instance of the nanosheet stacks 130; forming S/D trenches 302, 304; providing access to end regions of the SiGe sacrificial nanosheets 122, 124, 126, 127; and providing access to end regions of the Si nanosheets 114, 116, 118. The rightmost and leftmost nanosheet stacks 130 can each be part of an active or inactive transistor depending on the requirements of the IC design in which the nanosheet-based structure 100 will be incorporated. Where the rightmost and/or leftmost nanosheet stack 130 is part of an active transistor, the active transistor formed from rightmost and/or leftmost nanosheet stack 130 will be in series with the transistor formed from the center nanosheet stack 130 and will share a source or drain region with the transistor formed from the center nanosheet stack 130. Whether or not the transistors formed from the rightmost and leftmost nanosheet stacks 130 are active, the rightmost and leftmost nanosheet stacks 130 define portions of the S/D trenches 302, 304 in which S/D regions 602, 604 (shown in FIG. 6) will be formed.

Figure 4:
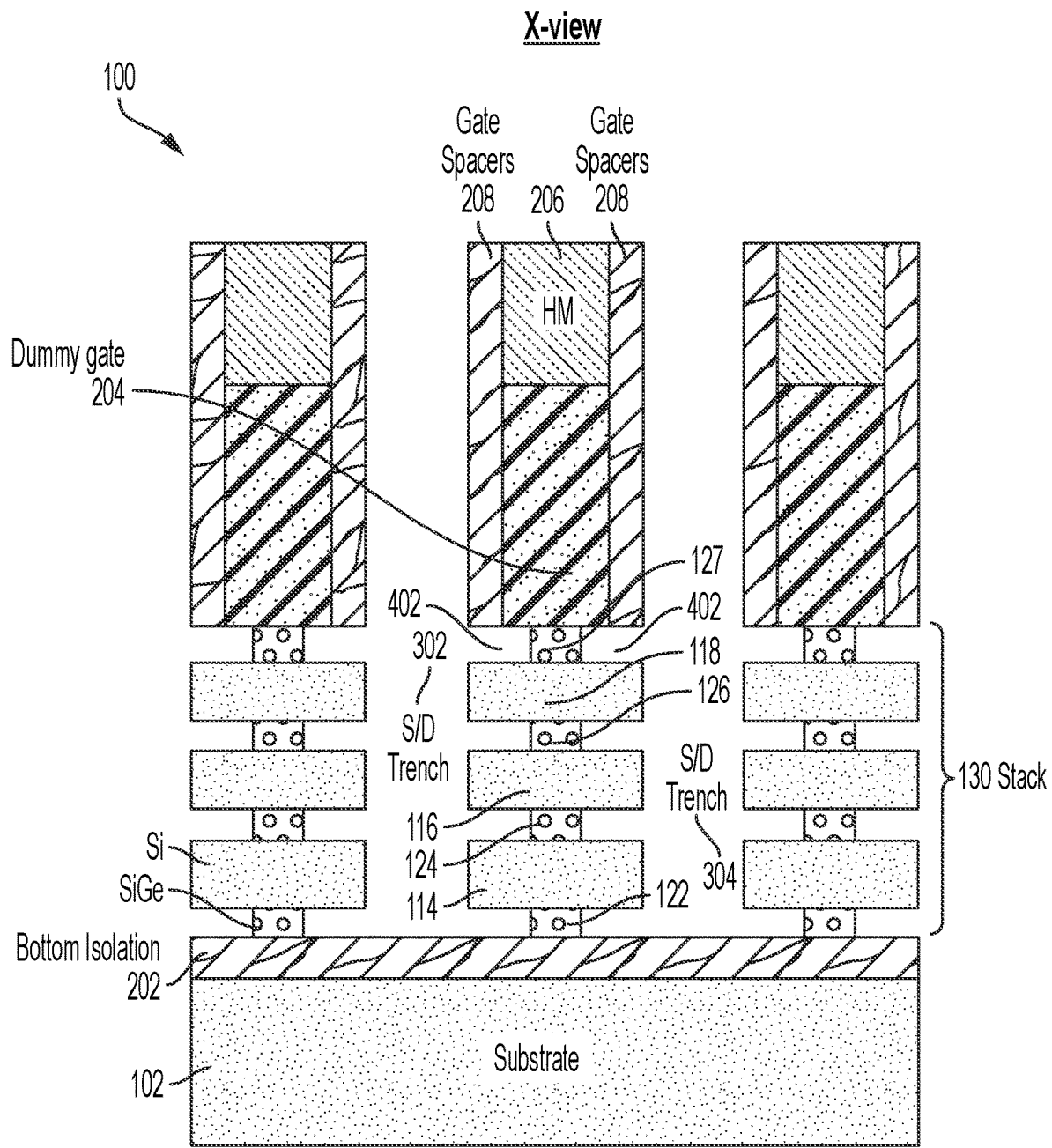

In FIG. 4, known semiconductor fabrication processes have been used to partially remove end regions of the SiGe sacrificial nanosheets 122, 124, 126, 127 to form end region or inner spacer cavities 402. In embodiments of the invention, the end regions of the SiGe sacrificial nanosheets 122, 124, 126, 127 can be removed using a so-called "pull-back" process to pull the SiGe sacrificial nanosheets 122, 124, 126, 127 back an initial pull-back distance such that the ends of the SiGe sacrificial nanosheets 122, 124, 126, 127 now terminate well past an inner edge of the gate spacers 208 in accordance with aspects of the invention. The pull-back process leverages the fact that the sacrificial nanosheets 122, 124, 126, 127 are formed from SiGe, which can be selectively etched with respect to the Si nanosheets 114, 116, 118 using, for example, a vapor phase hydrogen chloride (HCL) gas isotropic etch process.

Figure 5:
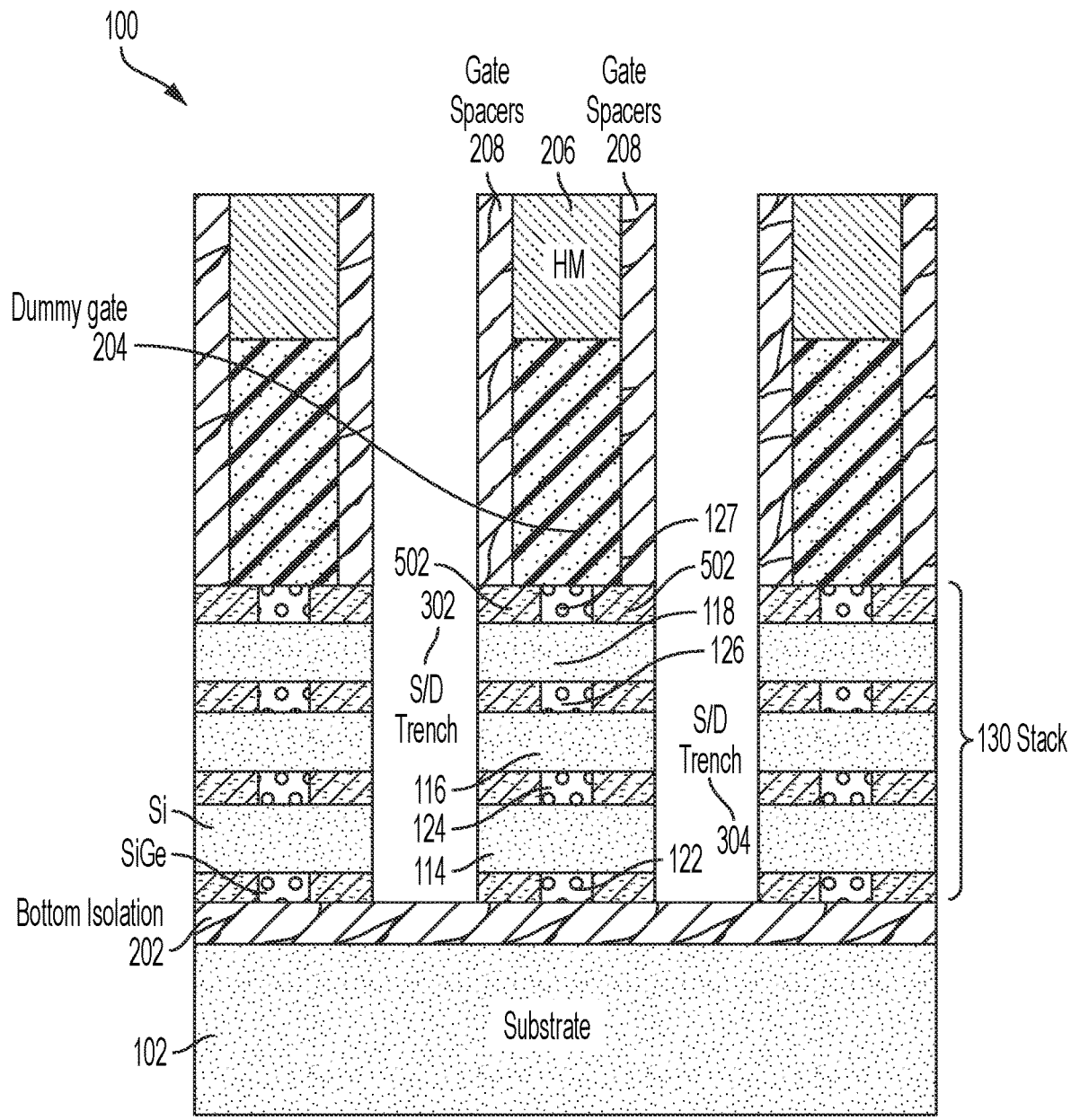

In FIG. 5, known semiconductor fabrication operations (e.g., ALD) have been used to conformally deposit a layer of inner spacer liner material 502 over the nanosheet-based structure 100. The inner spacer liner layer 502 can be silicon nitride, silicoboron carbonitride, silicon carbonitride, silicon carbon oxynitride, or any other type of dielectric material (e.g., a dielectric material having a dielectric constant k of less than about 5). Additionally, known semiconductor device fabrication processes have been used to form inner spacers 502 by applying an isotropic etch back on the inner spacer layer 502 to remove excess dielectric material on exposed vertical and horizontal surfaces of the nanosheet-based structure 100, thus leaving the portions of the inner spacer layer 502 that pinched off in the inner spacer cavities 402 (shown in FIG. 4), thereby forming the inner spacers 502.

Figure 6:
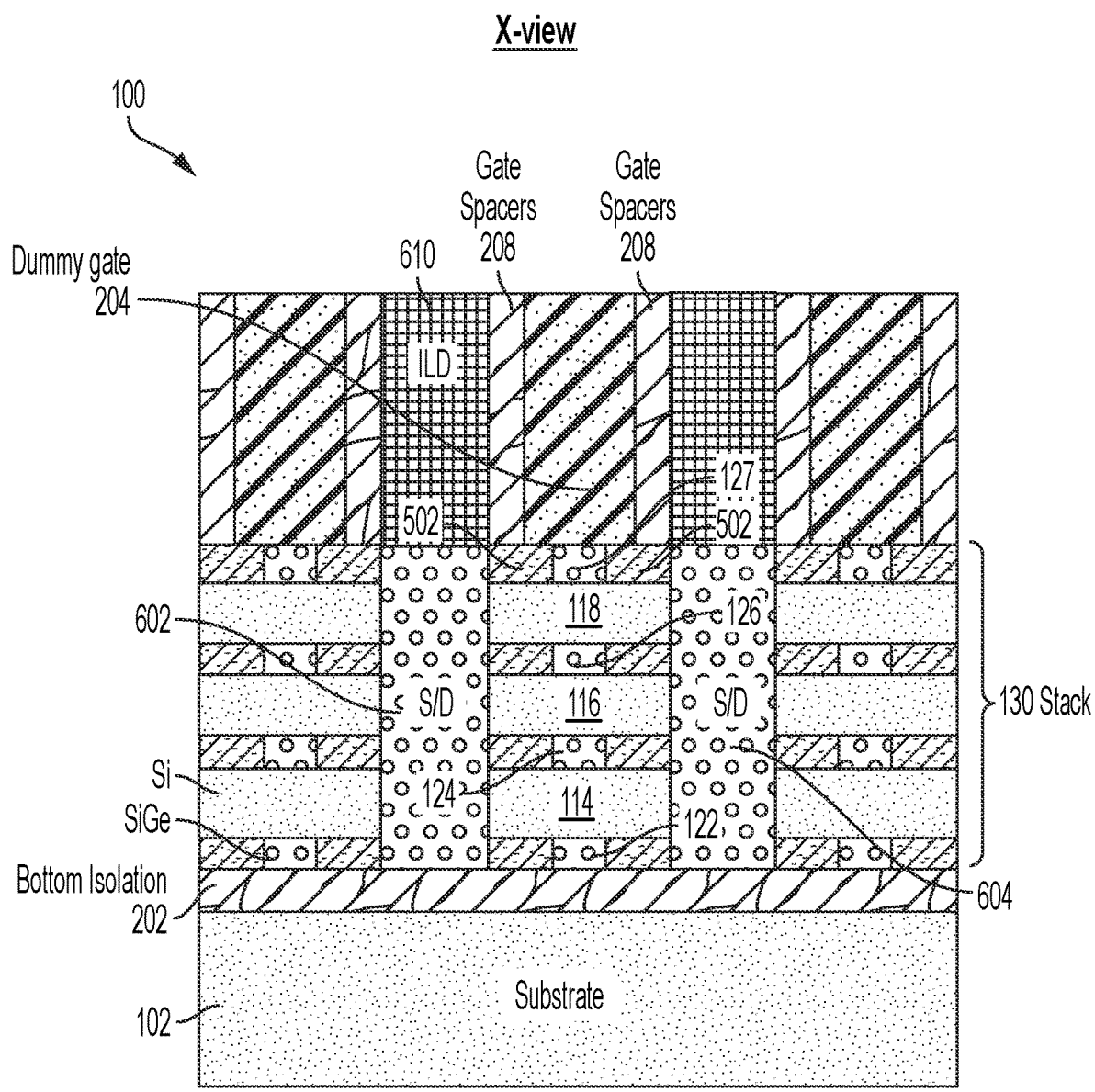

In FIG. 6, known fabrication operations have been used to form doped S/D regions 602, 604 in the S/D trenches 302, 304 (shown in FIG. 5). In embodiments of the invention, an epitaxial growth process can be used to grow the doped S/D regions 602, 604 from exposed ends of the Si nanosheets 114, 116, 118. In embodiments of the invention, the doped S/D regions 602, 604 can be epitaxially grown from gaseous or liquid precursors using, for example, vapor-phase epitaxy (VPE), molecular-beam epitaxy (MBE), liquid-phase epitaxy (LPE), or other suitable process. In embodiments of the invention, the doped S/D regions 602, 604 can be doped during deposition (e.g., in-situ doped) by adding dopants such as n-type dopants (e.g., phosphorus or arsenic) or p-type dopants (e.g., Ga, B, $BF_2$, or Al) during the above-described methods of forming the doped S/D regions 602, 604.

As also shown in FIG. 6, known semiconductor device fabrication processes have been used to deposit an interlayer dielectric (ILD) 610 to fill in remaining open spaces of the nanosheet-based structure 100 and stabilize the nanosheet-based structure 100. The structure 100 is planarized to a predetermined level that removes the hard masks 206 and some portions of the gate spacers 208. In aspects of the invention, the deposited ILD regions 610 can be formed from a low-k dielectric (e.g., k less than about 4) and/or an ultra-low-k (ULK) dielectric (e.g., k less than about 2.5).

Figure 7:
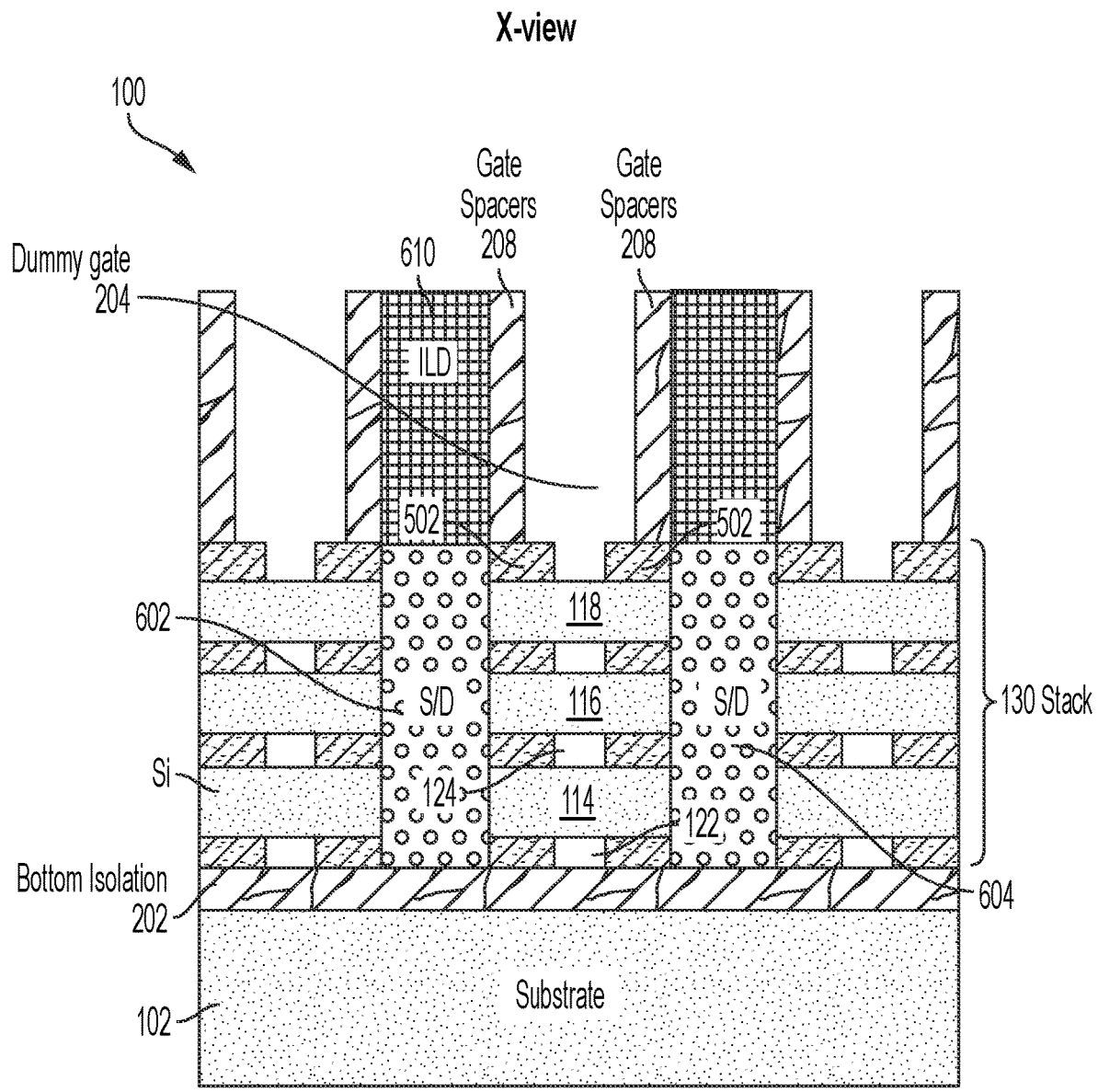

In FIG. 7, known semiconductor fabrication operations have been used to remove the sacrificial nanosheets 122, 124, 126, 127 and the dummy gates 204. The dummy gates 204 and the gate dielectric (not shown) can be removed by suitable known etching processes, e.g., RIE or wet removal processes. Known semiconductor fabrication operations can be used to remove the SiGe sacrificial nanosheets 122, 124, 126, 127 selective to the Si non-sacrificial nanosheets 114, 116, 118. In embodiments of the invention, because the sacrificial nanosheets 122, 124, 126, 127 are formed from SiGe, they can be selectively etched with respect to the Si nanosheets 114, 116, 118 using, for example, a vapor phase hydrogen chloride (HCL) gas isotropic etch process.

Figure 8:
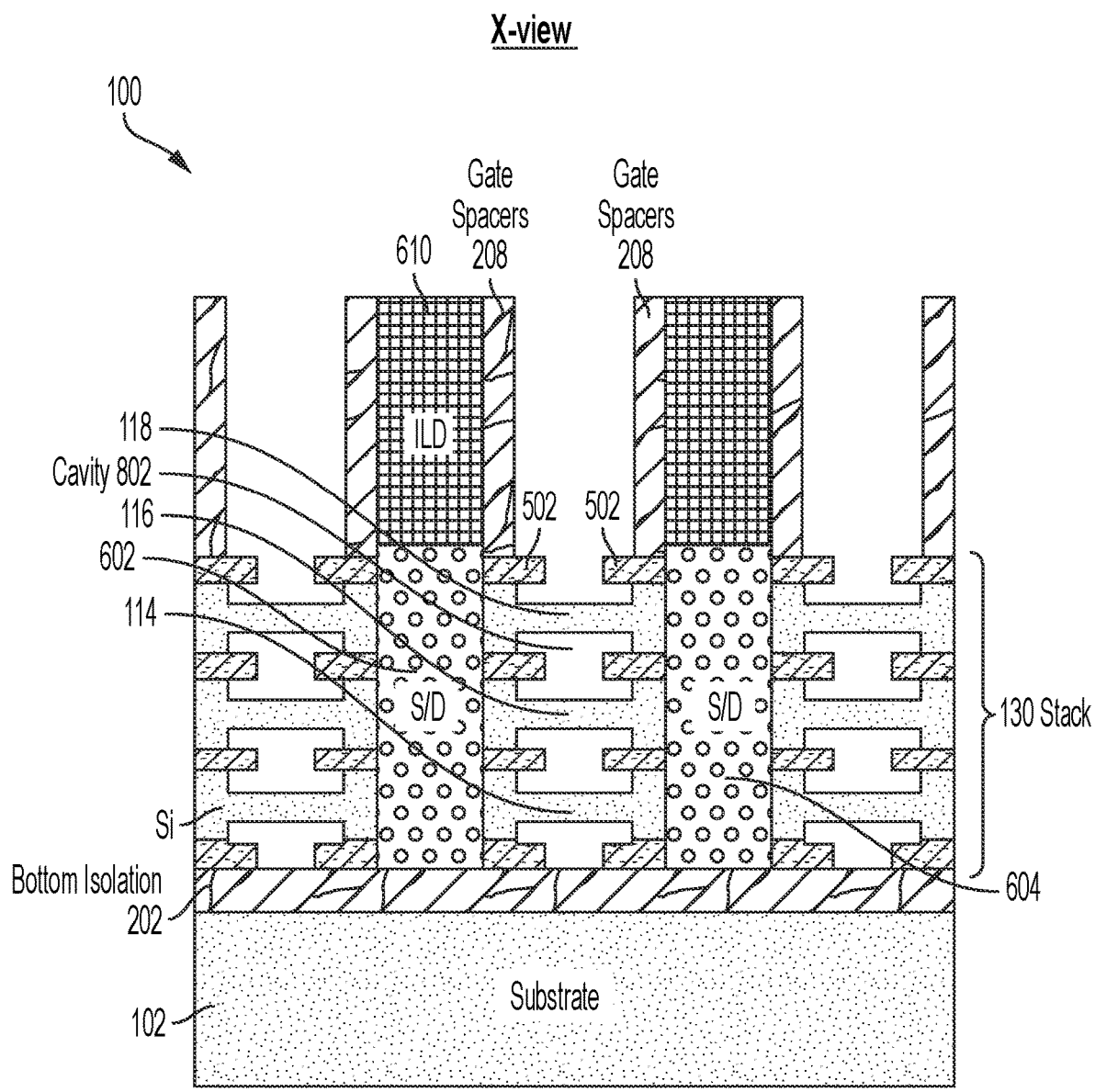

In FIG. 8, known fabrication operations (e.g., wet etching) have been used to trim the Si nanosheets 114, 116, 118 to a profile that forms a cavity/tunnel 802 defined by portions of the trimmed Si nanosheets 114, 116, 118 and portions of the inner spacers 502 in accordance with embodiments of the invention. In accordance with aspects of the invention, the amount of Si trimming is adjusted to have an appropriate overlap between the junctions and the gate in the final structure 1200 (shown in FIG. 12).

Figure 9:
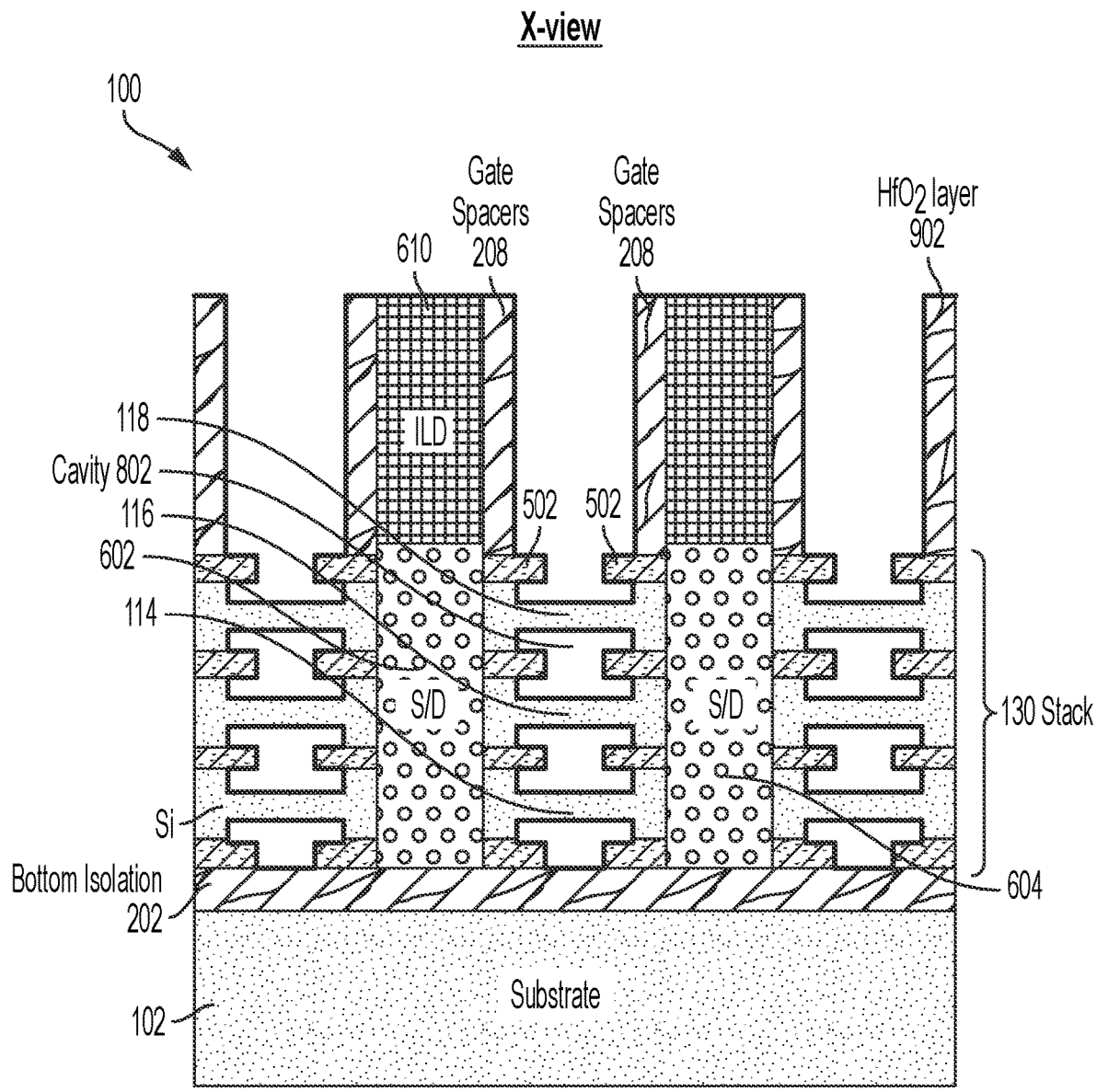

In FIG. 9, know fabrication processes (e.g., ALD deposition) have been used to deposit a high-k gate dielectric layer 902. In accordance with embodiments of the invention, the high-k gate dielectric layer 902 lines the cavity/tunnel 802 and can be a layer of $HfO_2$.

Figure 10:
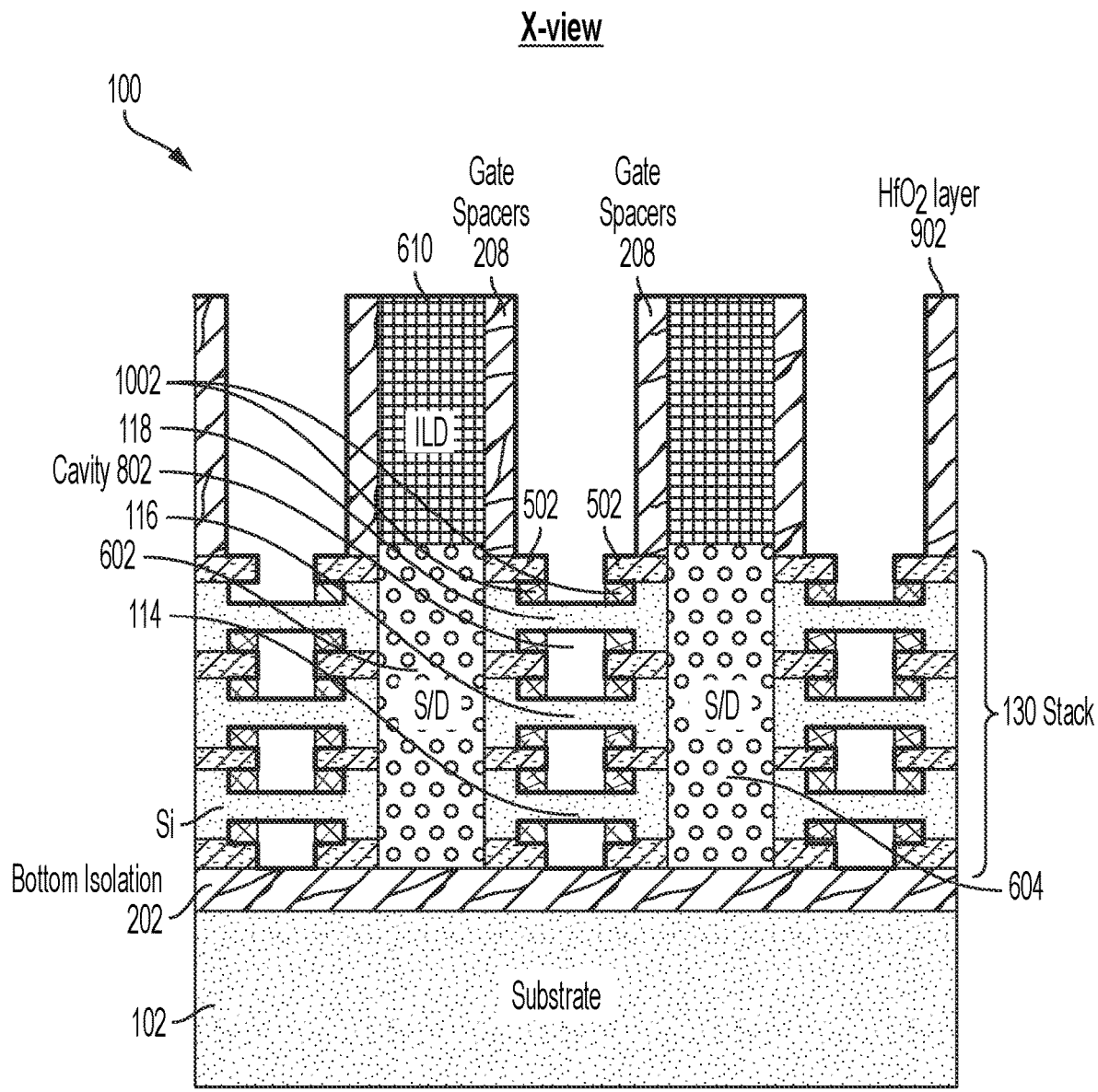

In FIG. 10, know metal deposition and recess operations can be used to deposit a first WFM 1002 in end regions of the cavities 802, leaving central regions of the cavities 802 open. In accordance with aspects of the invention, the first WFM 1002 is configured and arranged to provide a first WF. In accordance with aspects of the invention, the end regions of the cavities 802 are closer to the S/D regions 602, 604 than the central region of the cavities 802 are to the S/D regions 602, 604, thereby placing the first WFM 1002 closer to the S/D regions 602, 604 than the central regions of the cavities 802 are to the S/D regions 602, 604.

Figure 11:
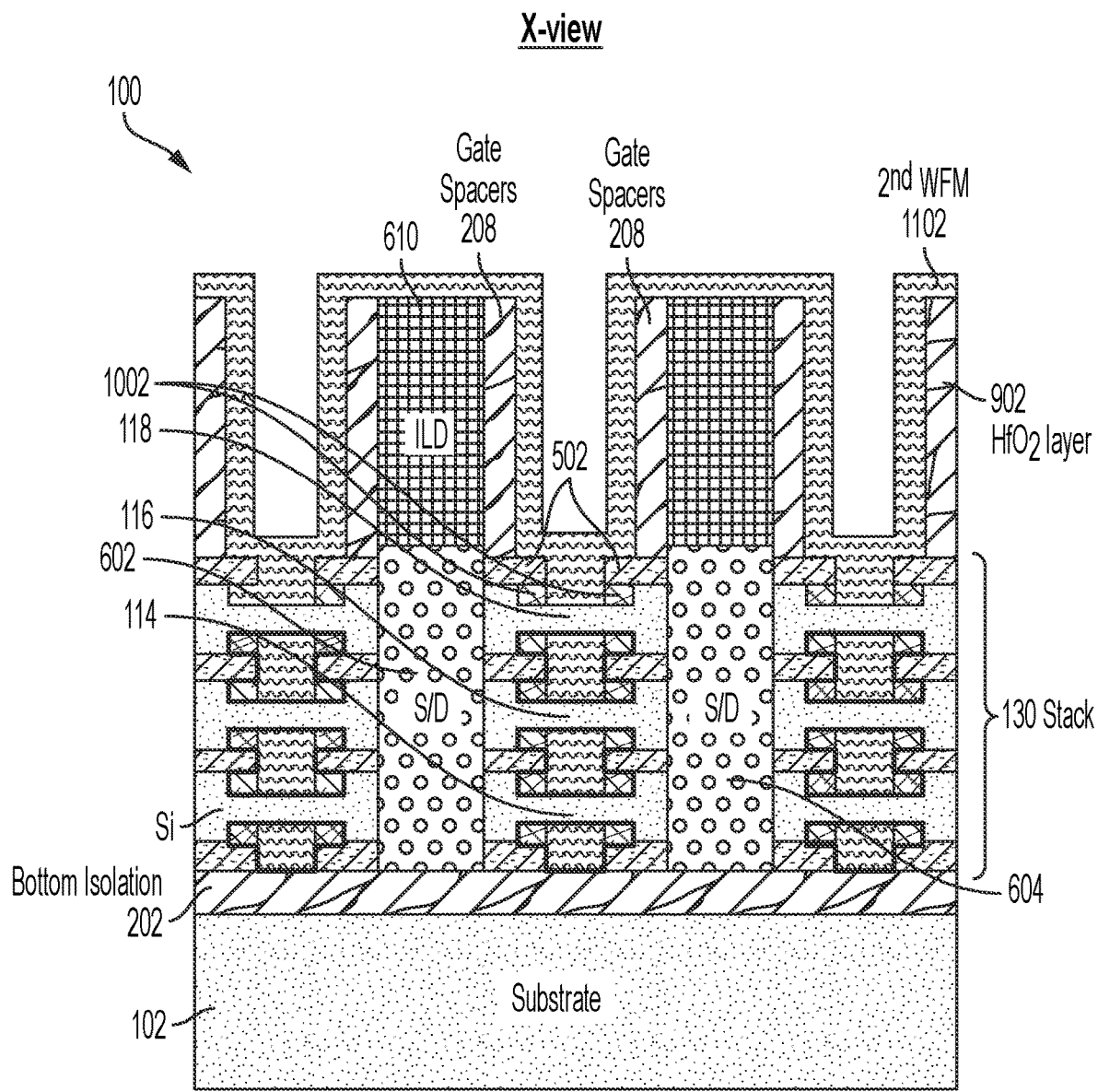

In FIG. 11, know metal deposition operations can be used to deposit a second WFM 1102 in central regions of the cavities 802. In accordance with aspects of the invention, the second WFM 1102 is configured and arranged to provide a second WF. In accordance with aspects of the invention, the central regions of the cavities 802 are further from the S/D regions 602, 604 than the end regions of the cavities 802 are from the S/D regions 602, 604, thereby placing the second WFM 1102 further from the S/D regions 602, 604 than the end regions of the cavities 802 are from the S/D regions 602, 604.

In accordance with aspects of the invention, the first WFM 1002 has a first WF, and the second WFM 1102 has second WF. The profile of the cavity/tunnel 802 in accordance with embodiments of the invention enables the cavity/tunnel 802 to position the first WFM 1002 closer to the S/D regions 602, 604 than second WFM 1102 is to the S/D regions 602, 604. In accordance with aspects of the invention, the first WF is different than the second WF, which creates a WF gradient between the central region of the cavity/tunnel 802 and the end regions of the cavity/tunnel 802. This WF gradient relaxes the electric field across the gate oxide 902, which reduces GIDL currents in the stacked nanosheet transistor 1200 (shown in FIG. 12).

In embodiments of the invention, the first WFM 1002 and the second WFM 1102 are formed from a combination of materials that provide appropriate threshold voltages for the stacked nanosheet transistor 1200 (shown in FIG. 12), while also providing a WF differential between the central regions of the cavities 802 and the end regions of the cavities 802, thereby relaxing the electric field across the gate oxide 902, which reduces GIDL currents in the stacked nanosheet transistor 1200. In some embodiments of the invention, the WFs are a property of the chosen WFM, and values of the chosen WFM's WF are modulated (increased or decreased) by layering an oxygen gettering material on the WFM and separated from the gate oxide. In general, a "gettering" or "getter" material is a reactive material that exhibits the property of "getting" or scavenging another material. For example, an oxygen getter material exhibits the property of combining with nearby oxygen molecules chemically or by absorption, which removes oxygen from either the environment or from another material to which the oxygen getter material is communicatively coupled. Al is an example of an oxygen gettering material because Al is effective at gettering (i.e., reacting with and removing) oxygen that is present in either the environment or another material to which the Al is communicatively coupled. By placing an oxygen gettering material such as aluminum on a WFM, the oxygen gettering material pulls oxygen from the gate oxide, which creates oxygen vacancies in the gate oxide, which reduces the EFW of the chosen WFM.

In some embodiments of the invention, the nanosheet transistor 1200 (shown in FIG. 12) is an NFET, the first WFM 1002 is a tri-layer that includes an oxygen gettering (or WF modulating) layer, and the second WFM 1102 is a tri-layer also including an oxygen getting (or WF modulating) layer. The first WFM 1002 can be a tri-layer formed from a layer of TiN at a first thickness (T1); a layer of Al-containing alloy (e.g., TiAlC); and a layer of TiN. The second WFM 1102 can be tri-layer formed from a layer of TiN at a second thickness (T2); a layer of Al-containing alloy (e.g., TiAlC); and a layer of TiN. In accordance with aspects of the invention, T1 is relatively thin, and T2 is relatively thick, which means that T1<T2. By providing a tri-layer WFM configuration for both the first WFM 1002 and the second WFM 1102, and by maintaining T1 relatively thin and less than T2, the oxygen gettering effects for the first WFM 1002 become higher than that for the second WFM 1102, resulting in lower thresholds voltage near the S/D regions 602, 604 compared to the center regions on the channels 114, 116, 118. This helps in reducing GIDL currents.

In some embodiments of the invention, the nanosheet transistor 1200 is a PFET, the first WFM 1002 is a WFM with no oxygen gettering layer, and the second WFM 1102 is a tri-layer that includes an oxygen gettering layer. The first WFM layer 1002 is formed from a layer of TiN. The second WFM 1102 is a tri-layer formed from a layer of TiN at a third thickness (T3); a layer of Al-containing alloy (e.g., TiAlC); and a layer of TiN. In accordance with aspects of the invention, T3 is relatively thick. In some embodiments of the invention T3>T2>T1. By providing a tri-layer WFM configuration for only the second WFM 1002, and by maintaining T3 relatively thick and greater than T2, lower threshold voltages near the S/D regions 602, 604 compared to the center region on the channels 114, 116, 118 can be achieved, while the threshold voltages of the center region remains acceptable for PFET devices.

Figure 12:
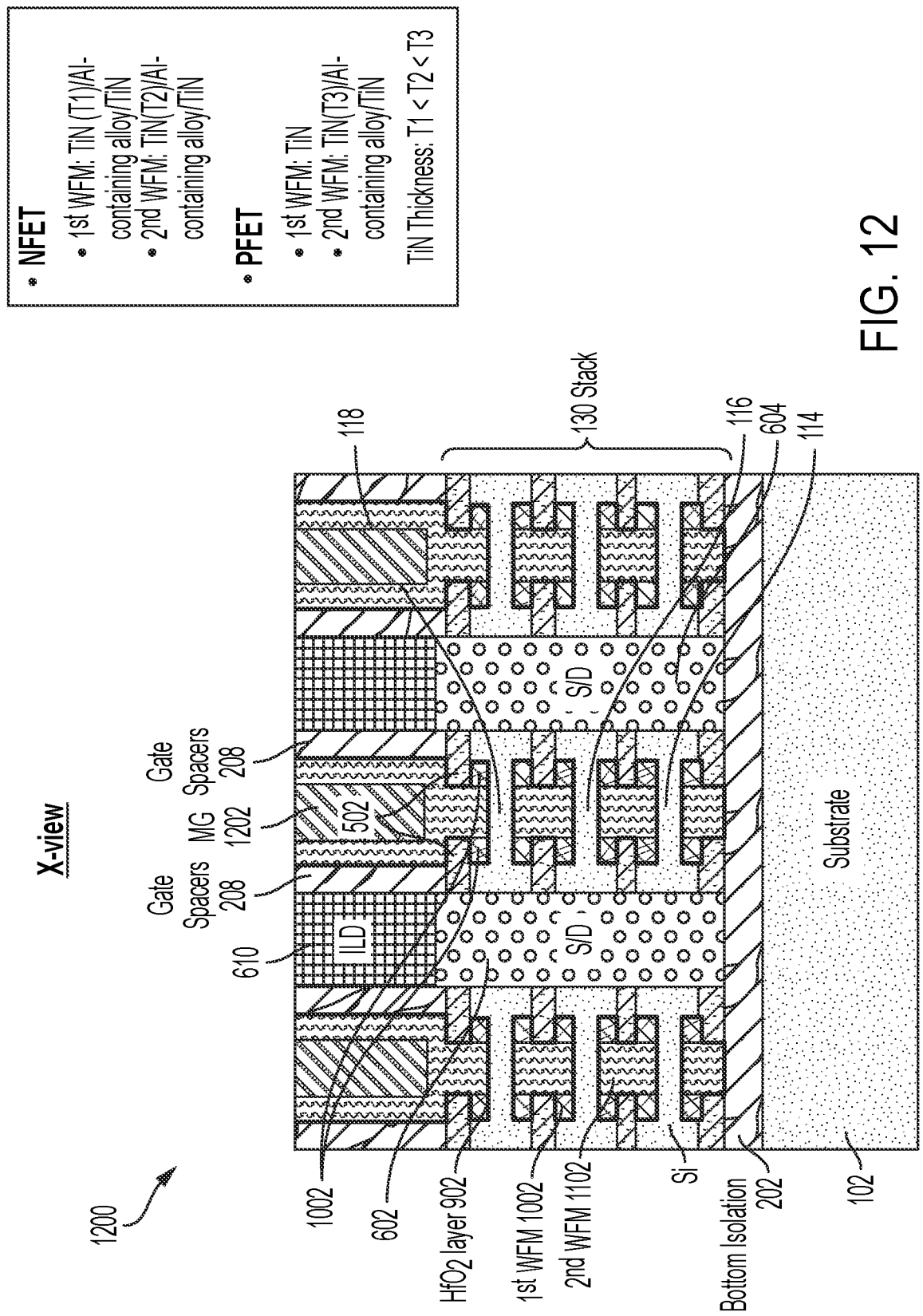

In FIG. 12, the completed nanosheet transistor 1200 if formed by depositing the metal gate 1202. The MG 1200 can be formed using any suitable known fabrication operations. The MG 1200, the gate dielectric 901, the first WFM 1002, and the second WFM 1102 form a high-k MG (HKMG) stack structures having WF gradients in accordance with aspects of the invention. The HKMG stack structures each surround the trimmed non-sacrificial nanosheets 114, 116, 118 and regulate electron flow through the non-sacrificial nanosheets 114, 116, 118. The metal gate 1202 structure can include metal liners. The dielectric layer 902 can include interfacial layers (IL) and high-k dielectric layers. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

The term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

References in the specification to terms such as "vertical", "horizontal", "lateral," etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit (IC) having transistor devices comprising a first transistor type, the first transistor type comprising:
   a channel stack comprising first stacked, spaced-apart, channel layers;
   wherein a first one of the first stacked, spaced-apart channel layers comprises a first trimmed channel region and first non-trimmed channel regions;
   a first source or drain (S/D) region communicatively coupled to the channel stack;
   a tunnel extending through the channel stack;

wherein a first portion of a boundary of the tunnel is defined by the first trimmed channel region;

wherein the tunnel comprises a central region and a first set of end regions;

wherein the first set of end regions is closer to the first S/D region than the central region is to the first S/D region;

a first type of work-function metal (WFM) formed in the first set of end regions, the first WFM having a first work-function (WF); and a second type of WFM formed in the central region, the second type of WFM having a second WF;

wherein the first WF is different than the second WF.

2. The IC of claim 1 further comprising a second S/D region communicatively coupled to the channel stack.

3. The IC of claim 2, wherein the tunnel further comprises a second set of end regions.

4. The IC of claim 3, wherein the second set of end regions is closer to the second S/D region than the central region is to the second S/D region.

5. The IC of claim 4, wherein the first type of WFM is formed in the second set of end regions.

6. The IC of claim 1 further comprising inner spacers.

7. The IC of claim 6, wherein a second portion of the boundary of the tunnel comprises a set of the inner spacers.

8. The IC of claim 7, wherein:
the boundary of the tunnel further comprises a second one of the stacked, spaced-apart channel layers;
the second one of the stacked, spaced-apart channel layers comprises a second trimmed channel region and second non-trimmed channel regions; and
a third portion of the boundary of the tunnel is defined by the second trimmed channel region.

9. The IC of claim 1 further comprising:
a gate dielectric within the tunnel;
wherein the first type of WFM comprises:
 a first layer of metal having a first thickness;
 a layer of an aluminum alloy; and
 a second layer of metal;
wherein the second type of WFM comprises:
 a third layer of metal having a second thickness;
 a layer of an aluminum alloy; and
 a fourth layer of metal; and
wherein the first thickness is less than the second thickness.

10. The IC of claim 9, wherein the transistor devices comprise a second transistor type, the second transistor type comprising:
a second-transistor-type channel stack comprising second stacked, spaced-apart, channel layers;
wherein a first one of the second stacked, spaced-apart channel layers comprises a second trimmed channel region and second non-trimmed channel regions;
a second-transistor-type S/D region communicatively coupled to the second-transistor-type channel stack;
a second-transistor-type tunnel extending through the second-transistor-type channel stack;
wherein a first portion of a boundary of the second-transistor-type tunnel is defined by the second trimmed channel region;
a second-transistor-type gate dielectric within the second-transistor-type tunnel;
wherein the second-transistor-type tunnel comprises a second-transistor-type central region and a second-transistor-type set of end regions;

wherein the second-transistor-type set of end regions is closer to the second-transistor-type S/D region than the second-transistor-type central region is to the second-transistor-type S/D region;

a first type of second-transistor-type work-function metal (WFM) formed in the second-transistor-type set of end regions, the first WFM having a first work-function (WF); and a second type of second-transistor-type WFM formed in the central region, the second type of WFM having a second WF;

wherein the first type of second-transistor-type WFM comprises a first layer of metal; and wherein the second type of second-transistor-type WFM comprises:
 a second layer of metal having a predetermined thickness;
 a layer of an aluminum alloy; and
 a third layer of metal;

wherein the predetermined thickness is greater than the second thickness.

11. A method of forming an integrated circuit (IC) having transistor devices comprising a first transistor type, the method comprising forming the first transistor type by performing fabrication operations comprising:
forming a channel stack comprising first stacked, spaced-apart, channel layers;
wherein a first one of the first stacked, spaced-apart channel layers comprises a first trimmed channel region and first non-trimmed channel regions;
forming a first source or drain (S/D) region communicatively coupled to the channel stack;
forming a tunnel extending through the channel stack;
wherein a first portion of a boundary of the tunnel is defined by the first trimmed channel region;
wherein the tunnel comprises a central region and a first set of end regions;
wherein the first set of end regions is closer to the first S/D region than the central region is to the first S/D region;
forming a first type of work-function metal (WFM) in the first set of end regions, the first WFM having a first work-function (WF); and
forming a second type of WFM in the central region, the second type of WFM having a second WF;
wherein the first WF is different than the second WF.

12. The method of claim 11 further comprising forming a second S/D region communicatively coupled to the channel stack.

13. The method of claim 12, wherein the tunnel further comprises a second set of end regions.

14. The method of claim 13, wherein the second set of end regions is closer to the second S/D region than the central region is to the second S/D region.

15. The method of claim 14, wherein the first type of WFM is formed in the second set of end regions.

16. The method of claim 11, wherein forming the tunnel comprises:
forming a set of inner spacers that extend under a gate structure of the transistor device; and
forming the first trimmed channel region.

17. The method of claim 16, wherein the boundary of the tunnel comprises the set of the inner spacers.

18. The method of claim 17, wherein:
the method further comprises forming a second one of the first stacked, spaced-apart channel layers;

wherein the second one of the first stacked, spaced-apart channel layers comprises a second trimmed channel region and second non-trimmed channel regions; and the boundary of the tunnel further comprises the second trimmed channel region.

19. The method of claim 11 further comprising:
forming a gate dielectric within the tunnel;
wherein the first type of WFM comprises:
   a first layer of metal having a first thickness;
   a layer of an aluminum alloy; and
   a second layer of metal; and
wherein the second type of WFM comprises:
   a third layer of metal having a second thickness;
   a layer of an aluminum alloy; and
   a fourth layer of metal;
wherein the first thickness is less than the second thickness.

20. The method of claim 19, wherein the transistor devices comprise a second transistor type and the fabrication operations further comprise:
   forming a second-transistor-type channel stack comprising stacked, spaced-apart, channel layers;
   forming a second-transistor-type S/D region communicatively coupled to the second-transistor-type channel stack;
   forming a second-transistor-type tunnel extending through the second-transistor-type channel stack;
   forming a second-transistor-type gate dielectric within the second-transistor-type tunnel;
   wherein the second-transistor-type tunnel comprises a second-transistor-type central region and a second-transistor-type set of end regions;
   wherein the second-transistor-type set of end regions is closer to the second-transistor-type S/D region than the second-transistor-type central region is to the second-transistor-type S/D region;
   forming a first type of second-transistor-type WFM formed in the second-transistor-type set of end regions, the first WFM having a first work-function (WF); and
   forming a second type of second-transistor-type WFM formed in the central region, the second type of WFM having a second WF;
   wherein the first type of second-transistor-type WFM comprises a first layer of metal; and
   wherein the second type of second-transistor-type WFM comprises:
     a second layer of metal having a predetermined thickness;
     a layer of an aluminum alloy; and
     a third layer of metal;
   wherein the predetermined thickness is greater than the second thickness.

\* \* \* \* \*